(12) United States Patent
Sasaki et al.

(10) Patent No.: US 10,727,254 B2
(45) Date of Patent: Jul. 28, 2020

(54) SEMICONDUCTOR DEVICE

(71) Applicant: Japan Display Inc., Tokyo (JP)

(72) Inventors: Toshinari Sasaki, Tokyo (JP); Hajime Watakabe, Tokyo (JP); Akihiro Hanada, Tokyo (JP); Marina Shiokawa, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 16/447,000

(22) Filed: Jun. 20, 2019

(65) Prior Publication Data

US 2019/0312064 A1 Oct. 10, 2019

Related U.S. Application Data

(62) Division of application No. 15/619,677, filed on Jun. 12, 2017, now Pat. No. 10,373,982.

(30) Foreign Application Priority Data

Jun. 20, 2016 (JP) .................. 2016-121685

(51) Int. Cl.
*H01L 27/12* (2006.01)
*H01L 29/786* (2006.01)
(Continued)

(52) U.S. Cl.
CPC ........ *H01L 27/1225* (2013.01); *H01L 27/124* (2013.01); *H01L 27/1248* (2013.01);
(Continued)

(58) Field of Classification Search
CPC ............... H01L 27/1225; H01L 27/124; H01L 27/1248; H01L 29/7869
See application file for complete search history.

(56) References Cited

U.S. PATENT DOCUMENTS 6,777,716 B1 8/2004 Yamazaki et al.
2006/0267141 A1 11/2006 Saito
(Continued)

FOREIGN PATENT DOCUMENTS

JP 2012-227521 A 11/2012

OTHER PUBLICATIONS

Partial English Machine Translation of Japanese Office Action dated Jan. 28, 2020 for the corresponding Japanese application No. 2016-121685, retrieved from the EPO Global Dossier.
(Continued)

*Primary Examiner* — Matthew C Landau
*Assistant Examiner* — Dmitriy Yemelyanov
(74) *Attorney, Agent, or Firm* — Michael Best & Friedrich LLP

(57) ABSTRACT

A semiconductor device includes a oxide semiconductor layer, a gate electrode arranged above the oxide semiconductor layer, a gate insulation layer between the oxide semiconductor layer and the gate electrode, a first insulation layer arranged above the oxide semiconductor layer and arranged with a first aperture part, wiring including an aluminum layer arranged above the first insulation layer, the wiring being electrically connected to the oxide semiconductor layer via the first aperture part, a barrier layer including aluminum oxide above the first insulation layer, above the wiring and covering a side surface of the wiring, and an organic insulation layer arranged above the barrier layer.

5 Claims, 11 Drawing Sheets

(51) Int. Cl.
*H01L 29/423* (2006.01)
*H01L 29/49* (2006.01)

(52) U.S. Cl.
CPC .... *H01L 29/42384* (2013.01); *H01L 29/4908* (2013.01); *H01L 29/7869* (2013.01)

(56) References Cited

U.S. PATENT DOCUMENTS

| | | | | |
|---|---|---|---|---|
| 2007/0252145 | A1* | 11/2007 | Toyota | H01L 29/4908 257/59 |
| 2010/0090217 | A1* | 4/2010 | Akimoto | H01L 29/7869 257/43 |
| 2011/0095312 | A1* | 4/2011 | Murakami | G02F 1/13454 257/89 |
| 2011/0210355 | A1 | 9/2011 | Yamazaki et al. | |
| 2012/0258575 | A1 | 10/2012 | Sato et al. | |
| 2016/0005873 | A1 | 1/2016 | Jintyou et al. | |

OTHER PUBLICATIONS

Chinese Office Action dated Mar. 27, 2020, for the corresponding Chinese application No. 20170324502.3 with partial English machine translation retrieved from the EPO Global Dossier.

* cited by examiner (A)

(B)

SEMICONDUCTOR DEVICE

CROSS REFERENCE TO RELATED APPLICATIONS

This application is a divisional of U.S. patent application Ser. No. 15/619,677, filed on Jun. 12, 2017. Further, this application is based upon and claims the benefit of priority from the prior Japanese Patent Application No. 2016-121685 filed on 5 Jun. 20, 2016, the entire contents of which are incorporated herein by reference.

FIELD

The present invention is related to a semiconductor device. In particular, the present invention is related to a semiconductor device in which an oxide semiconductor layer is used in a channel.

BACKGROUND

Recently, a driving circuit of a display device, a personal computer or the like includes a semiconductor device such as a transistor, a diode or the like as a microscopic switching element. Especially in a display device, a semiconductor device is used as a selective transistor that supplies a voltage or a current in accordance with the gray scale of each of pixels and also used in a driving circuit that selects a pixel to which the voltage or the current is to be supplied. The characteristics required of a semiconductor device vary in accordance with the use thereof. For example, a semiconductor device used as a selective transistor is required to have a low off-current or little variance from other selective semiconductors. A semiconductor device used in a driving circuit is required to have a high on-current.

To be used in a display device as described above, a semiconductor device including a channel formed of amorphous silicon, low-temperature polysilicon or single crystalline silicon has been conventionally developed. The semiconductor device including a channel formed of amorphous silicon or low-temperature polysilicon is formed in a process of 600° C. or lower, and therefore can be formed by use of a glass substrate. Especially, a semiconductor device including a channel formed of amorphous silicon can be formed with a simpler structure and in a process of 400° C. or lower, and therefore can be formed, for example, by use of a large glass substrate referred to as an eighth-generation glass substrate (2160×2460 mm). However, such a semiconductor device including a channel formed of amorphous silicon has a low mobility and is not usable in a driving circuit.

A semiconductor device including a channel formed of low-temperature polysilicon or single crystalline silicon has a higher mobility than the semiconductor device including a channel formed of amorphous silicon, and therefore is usable as a selective transistor and also in a driving circuit. However, such a semiconductor device including a channel formed of low-temperature polysilicon or single crystalline silicon has a complicated structure and needs a complicated process to be manufactured. In addition, such a semiconductor device needs to be formed in a process of 500° C. or higher, and therefore cannot be formed by use of a large glass substrate as described above. A semiconductor device including a channel formed of amorphous silicon, low-temperature polysilicon or single crystalline silicon has a high off-current. In the case where such a semiconductor device is used as a selective transistor, it is difficult to keep the applied voltage for a long time.

For the above-described reasons, a semiconductor device including a channel formed of an oxide semiconductor, instead of amorphous silicon, low-temperature polysilicon or single crystalline silicon, has been progressively developed recently (e.g., Japanese Laid-Open Patent Publication No. 2012-227521). It is known that a semiconductor device including a channel formed of an oxide semiconductor can be formed with a simple structure and in a low-temperature process like a semiconductor device including a channel formed of amorphous silicon, and has a mobility higher than that of a semiconductor device including a channel formed of amorphous silicon. It is also known that such a semiconductor device including a channel formed of an oxide semiconductor has a very low off-current.

However, an oxide semiconductor is easily influenced by impurities like moisture, hydrogen and ammonia. When moisture, hydrogen and ammonia enter an oxide semiconductor layer used for a channel, there occurs a problem that the characteristics of the semiconductor device are varied. In order to solve this problem, it has been studied to provide a barrier layer, having a blocking characteristic against moisture or impurities, above the oxide semiconductor layer. However, a conventional structure of a barrier layer does not sufficiently block moisture or impurities from the exterior of the semiconductor device or the other layers which configure the semiconductor device, which causes a problem that the reliability of the semiconductor device is decreased.

SUMMARY

A semiconductor device according to one embodiment of the present invention includes a oxide semiconductor layer, a gate electrode above the oxide semiconductor layer, a gate insulation layer between the oxide semiconductor layer and the gate electrode, a first insulation layer above the oxide semiconductor layer and a first aperture part arranged in the first insulation layer, wiring including an aluminum layer above the first insulation layer, the wiring being electrically connected to the oxide semiconductor layer via the first aperture part, a barrier layer including aluminum oxide above the first insulation layer, above the wiring and covering a side surface of the wiring, and an organic insulation layer arranged above the barrier layer.

A semiconductor device according to one embodiment of the present invention includes a gate electrode, a gate insulation layer between the gate electrode and a oxide semiconductor layer, a first insulation layer above the oxide semiconductor layer and a first aperture part arranged in the first insulation layer, wiring including an aluminum layer above the first insulation layer, the wiring being electrically connected to the oxide semiconductor layer via the first aperture part, a barrier layer including aluminum oxide above the first insulation layer, above the wiring and covering a side surface of the wiring, and an organic insulation layer above the barrier layer.

DESCRIPTION OF EMBODIMENTS

Figure 1:
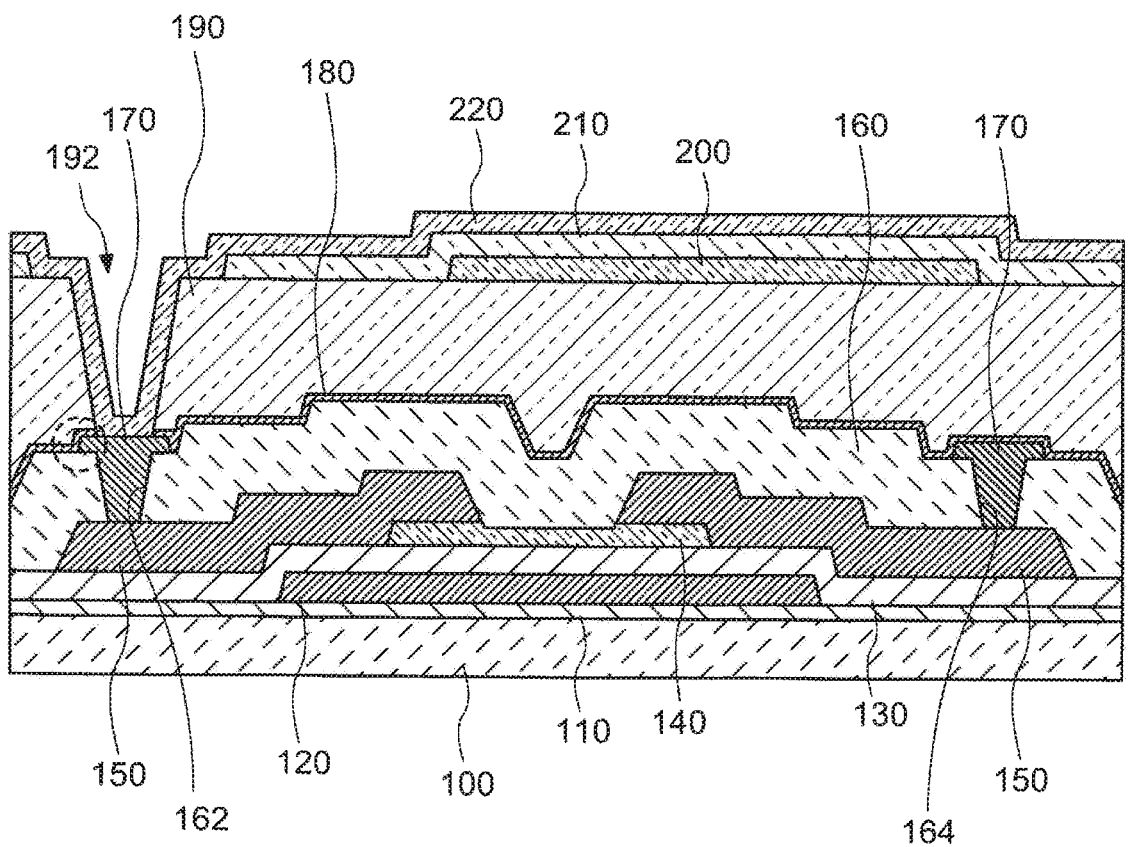
FIG. 1 is a cross-sectional diagram showing a summary of a semiconductor device related to one embodiment of the present invention.

Hereinafter, embodiments of the present invention will be described with reference to the drawings. The disclosure is merely exemplary, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted. The following embodiments are presented for the purpose of providing a highly reliable semiconductor device and a manufacturing method of such a semiconductor device.

First Embodiment

With reference to FIG. 1, an overview of a semiconductor device 10 in embodiment 1 according to the present invention will be described. The semiconductor device 10 in embodiment 1 is usable in a pixel or a driving circuit of a liquid crystal display device (LCD), a spontaneous emission display device using an organic light-emitting diode (OLED) such as an organic EL element, a quantum dot or the like for a display unit, or a reflection-type display device such as an electronic paper or the like.

However, the semiconductor device related to the present invention is not limited to those used in a display device. For example, the semiconductor device related to the present invention may also be used in integrated circuits (IC) such as micro-processing units (MPU). The semiconductor device 10 of the first embodiment is a semiconductor device having a structure in which an oxide semiconductor is used as a channel. Although a transistor is exemplified as a semiconductor device in the first embodiment, this does not limit the semiconductor device related to the present invention to a transistor.

[Structure of a Semiconductor Device 10]

FIG. 1 is a cross-sectional diagram showing a summary of a semiconductor device related to a first embodiment of the present invention. As is shown in FIG. 1, the semiconductor device 10 includes a substrate 100, an underlayer 110, a gate electrode 120, a gate insulation layer 130, an oxide semiconductor layer 140, a source electrode and drain electrode 150, a first insulation layer 160, a wiring layer 170, a barrier layer 180, a second insulation layer 190, a first electrode 200, a third insulation layer 210 and a second electrode 220. The semiconductor device 10 is a bottom-gate type transistor.

The substrate 100 has flexibility. The underlayer 110 is arranged above the substrate 100. The gate electrode 120 is arranged above the underlayer 110. The gate insulation layer 130 is arranged above the gate electrode 120 and above the underlayer 110 exposed from the gate electrode 120. The oxide semiconductor layer 140 is arranged above the gate insulation layer 130. The oxide semiconductor layer 140 is arranged in a region including a channel region of the semiconductor device 10. The source electrode and drain electrode 150 is arranged above the oxide semiconductor layer 140 and above the gate insulation layer 130 exposed from the oxide semiconductor layer 140.

The source electrode and drain electrode 150 exposes a part of the oxide semiconductor layer 140 at a pattern end part of the source electrode and drain electrode 150. The film thickness of the oxide semiconductor layer 140 exposed from the source electrode and drain electrode 150 is thinner than the film thickness of the oxide semiconductor layer 140 whose upper part is covered by the source electrode and drain electrode 150. In other words, a part of the oxide semiconductor layer 140 in a region exposed from the source electrode and drain electrode 150 is etched. That is, the semiconductor device 10 is a channel etched type transistor.

The first insulation layer 160 is arranged above the source electrode and drain electrode 150, above the oxide semiconductor layer 140 exposed from the source electrode and drain electrode 150, and above the gate insulation layer 130 exposed from the source electrode and drain electrode 150. Aperture parts 162, 164 are arranged in the first insulation layer 160. The wiring layer 170 is arranged above the first gate insulation layer 160 and is connected to the source electrode and drain electrode 150 via the aperture parts 162, 164. That is, the wiring layer 170 is electrically connected to the oxide semiconductor layer 140 via the source electrode and drain electrode 150. Although described in detail herein, the wiring layer 170 includes an aluminum layer. The wiring layer 170 may also be a single aluminum layer or a stacked layer including an aluminum layer.

The barrier layer 180 covers the top of the first insulation layer 160, the top of the wiring layer 170, and a side surface of the wiring layer 170. In other words, the barrier layer 180 covers a pattern end part of the wiring layer 170. The barrier layer 180 contacts the wiring layer 170 above the wiring layer 170 and at the side surface of the wiring layer 170. Although described in detail herein, the barrier layer 180 includes an aluminum oxide layer. The barrier layer 180 may also be a single aluminum oxide layer or a stacked layer including an aluminum oxide layer. The second insulation layer 190 is arranged above the barrier layer 180. The second insulation layer 190 is an organic insulation layer including a resin. The barrier layer 180 separates an aluminum layer of the wiring layer 170 and the second insulation layer 190, and suppresses the second insulation layer 190 contacting the aluminum layer. An aperture part 192 which reaches a top surface of the wiring layer 170 is arranged in the barrier layer 180 and second insulation layer 190.

The first electrode 200 is arranged above the second insulation layer 190. The second electrode 220 is arranged at a position opposing the first electrode 200 and is electrically connected to the wiring layer 170 via the aperture part 192. The third insulation layer 210 is arranged between the first electrode 200 and the second electrode 220 and electrically insulates the first electrode 200 and second electrode 220. Although the third insulation layer 210 is arranged above the second insulation layer 190, the third insulation layer 210 has an aperture. The diameter of the aperture of third insulation layer 210 is wider than the diameter of the aperture part 192. The aperture of third insulation layer 210 is arranged at the periphery of the aperture part 192. That is, the third insulation layer 210 exposes a part of an upper surface of the second insulation layer 190.

The first electrode 200, the third insulation layer 210 and second electrode 220 are capacitors. The third insulation layer 210 is a dielectric of the capacitors. Although a structure is exemplified in FIG. 1 in which the second electrode 200 is connected to the wiring layer 170, the first electrode 200 may also be connected to the wiring layer 170. Although a structure is shown in FIG. 1 in which the second insulation layer 190 exposed from the third insulation layer 210 is covered by the second electrode 220, the second insulation layer 190 may also be exposed from the second electrode 220.

Transmittance to water, hydrogen or ammonia of the barrier layer 180 is lower than transmittance to water, hydrogen or ammonia of the third insulation layer 210. That is, in the case where water, hydrogen or ammonia is discharged from the second insulation layer 190, the discharged water, hydrogen or ammonia is blocked by the barrier layer 180 and is discharged to the exterior passing through the third insulation layer 210 via an aperture part of the third insulation layer 210. Therefore, water, hydrogen or ammonia discharged from the second insulation layer 190 is suppressed from reaching the oxide semiconductor layer 140.

[Material of Each Component Structuring the Semiconductor Device 10]

It is possible to use a polyimide substrate as the substrate 100. In addition to a polyimide substrate, it is possible to use an acrylic substrate, siloxane substrate or an insulation substrate including a resin such as a fluororesin substrate. Impurities may also be introduced to the substrate described above in order to improve thermal resistance of the substrate 100. In particular, in the case where the semiconductor device 10 is a top-emission type display, it is possible to use impurities which degrade transparency of the substrate 100 since it is not necessary for the substrate 100 to be transparent. On the other hand, in the case where it is not necessary that the substrate 100 have flexibility, it is possible to use a glass substrate, a silica substrate and an insulation substrate including translucency such as a sapphire substrate as the substrate 100. In the case where the semiconductor device 10 is not a display device but an integrated circuit, it is possible to use a semiconductor substrate such as a silicon substrate, a silicon carbide substrate or compound semiconductor substrate, a conductive substrate such as a stainless substrate, or a substrate which does not have translucency.

The underlying layer 110 may be formed of a material that increases the adhesiveness between the substrate 100 and the gate electrode 120. The underlying layer 110 may be formed of, for example, silicon oxide ($SiO_x$), silicon oxide nitride ($SiO_xN_y$), silicon nitride oxide ($SiN_xO_y$), silicon nitride ($SiN_x$), aluminum oxide ($AlO_x$), aluminum oxide nitride ($AlO_xN_y$), aluminum nitride oxide ($AlN_xO_y$), aluminum nitride ($AlN_x$), or the like (x and y each represent an arbitrary positive value). Alternatively, the underlying layer 110 may have a structure including a stack of films of any of such materials. In the case where a sufficient adhesiveness is guaranteed between the substrate 100 and the gate electrode 120, the underlying layer 110 may be omitted. The underlying layer 110 may be formed of a material that suppresses diffusion of impurities from the substrate 100 into the oxide semiconductor layer 140. The underlying layer 110 may be formed of an inorganic insulating material as listed above, TEOS, or an organic insulating material.

$SiO_xN_y$ and $AlO_xN_y$ are respectively a silicon compound and an aluminum compound containing nitrogen (N) at a lower content than oxygen (O). $SiN_xO_y$ and $AlN_xO_y$ are respectively a silicon compound and an aluminum compound containing oxygen at a lower content than nitrogen.

The underlying layer 110 described above as an example may be formed by a PVD (Physical Vapor Deposition) method or a CVD (Chemical Vapor Deposition) method. Examples of the usable PVD method include sputtering, vacuum vapor deposition, electron beam vapor deposition, plating, molecular beam epitaxy, and the like. Examples of the usable CVD method include thermal CVD, plasma CVD, catalyst CVD (Cat (catalytic)-CVD or hot-wire CVD), and the like. The "TEOS layer" refers to a CVD layer formed of TEOS (Tetra Ethyl Ortho Silicate).

Examples of the usable organic insulating material include a polyimide resin, an acrylic resin, an epoxy resin, a silicone resin, a fluorine resin, a siloxane resin, and the like. The underlying layer 110 may be formed of a single layer or a stack of films of such materials. For example, the underlying layer 110 may include a stack of an inorganic insulating material and an organic insulating material.

The gate electrode 120 may be formed of a commonly used metal material or a commonly used conductive semiconductor material. For example, the gate electrode 120 may be formed of aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt), bismuth (Bi), or the like. Alternatively, the gate electrode 120 may be formed of an alloy of such materials or a nitride of such materials. Still alternatively, the gate electrode 120 may be formed of a conductive oxide semiconductor such as ITO (indium tin oxide), IGO (indium gallium oxide), IZO (indium zinc oxide), GZO (zinc oxide containing gallium as a dopant), or the like. The gate electrode 120 may have a structure including a stack of films of any of such materials.

Preferably, the material used for the gate electrode 120 is resistant to a heat treatment step in a manufacturing process of a semiconductor device including a channel formed of an oxide semiconductor, and has a work function with which the transistor is of an enhancement type that is turned off when a voltage of 0 V is applied to the gate electrode 120.

It is possible to use an inorganic insulation material such as $SiN_x$, $SiN_xO_y$, $SiO_xN_y$, $AlN_x$, $AlN_xO_y$ and $AlO_xN_y$ as the gate insulation layer 130. The gate insulation layer 130 can be formed by the same method as the underlayer 110. It is possible to use a structure in which the insulation layers described above are stacked for the gate insulation layer 130. The gate insulation layer 130 may be the same material as or a different material than the underlayer 110. The gate insulation layer 130 is preferred to include a gas component such as H$_2$O or a blocking ability of movable ions such as Na for example.

The oxide semiconductor layer 140 may be formed of a metal oxide material having the characteristics of a semiconductor. For example, the oxide semiconductor layer 140 may be formed of an oxide semiconductor containing indium (In), gallium (Ga), zinc (Zn) and oxygen (O). Especially, the oxide semiconductor layer 140 may be formed of an oxide semiconductor having a composition ratio of In:Ga:Zn:O=1:1:1:4. It should be noted that the oxide semiconductor used in the present invention and containing In, Ga, Zn and O is not limited to having the above-described composition ratio. An oxide semiconductor having a different composition ratio is also usable. For example, in order to improve the mobility, the ratio of In may be increased. In order to increase the bandgap and thus decrease the influence of light, the ratio of Ga may be increased.

The oxide semiconductor containing In, Ga, Zn and O may contain another element added thereto. For example, a metal element such as Al, Sn or the like may be added. Instead of the above-described oxide semiconductor, zinc oxide (ZnO), nickel oxide (NiO), tin oxide (SnO$_2$), titanium oxide (TiO$_2$), vanadium oxide (VO$_2$), indium oxide (In$_2$O$_3$), strontium titanate (SrTiO$_3$), or the like may be used. The oxide semiconductor layer 140 may be amorphous or crystalline. Alternatively, the oxide semiconductor layer 140 may have a mixed phase of an amorphous phase and a crystalline phase.

It is possible to use a general metal material or a conductive semiconductor material the same as the gate electrode 120 as the source electrode and drain electrode 150. For example, it is possible to use Al, Ti, Cr, Co, Ni, Zn, Mo, In, Sn, Hf, Ta, W, Pt or Bi and the like as the source electrode and drain electrode 150. An alloy of these materials may also be used as the source electrode and drain electrode 150. A nitride of these materials may also be used as the source electrode and drain electrode 150. A conductive oxide semiconductor such as ITO, IGO, IZO and GZO and the like may also be used as the source electrode and drain electrode 150. A structure in which these films are stacked may also be used as the source electrode and drain electrode 150. The material used as the source electrode and drain electrode 150 is preferred to include thermal resistance to a heat treatment process in the manufacturing process of the semiconductor device using an oxide semiconductor as a channel, and a material which has a low contact resistance with the oxide semiconductor layer 140 is preferred to be used.

It is possible to use an inorganic insulation material such as SiO$_x$, SiO$_x$N$_y$, AlO$_x$, AlO$_x$N$_y$ or a TEOS layer and the like as the first insulation layer 160. The first insulation layer 160 can be formed using the same method as the underlayer 110. A structure in which the insulation layers described above are stacked can be used for the first insulation layer 160. It is possible to use a material for the first insulation layer 160 which includes a large amount of oxygen compared to the stoichiometric ratio of a material used as the first insulation layer 160. The first insulation layer 160 may be the same material as or a different material than the gate insulation layer 130.

It is possible to use an insulation material which includes an aluminum oxide such as AlO$_x$, AlO$_x$N$_y$ or AlN$_x$O$_y$ and the like as the barrier layer 180. In particular, it is possible to use a layer including an aluminum oxide such as AlO$_x$, AlO$_x$N$_y$ and the like as the main component as the barrier layer 180. It is possible to form the barrier layer using a sputtering method. Although described in detail herein, by forming the barrier layer 180 using a sputtering method, it is possible to form an oxygen doped region in an aluminum layer exposed at the pattern end part of the wiring layer 170. Therefore, the aluminum layer of the wiring layer 170 can suppress contact with the second insulation layer 190.

It is possible to use a polyimide resin, acrylic resin, epoxy resin, silicon resin, fluororesin and siloxane resin and the like as the second insulation layer 190. The second insulation layer 190 may be a photosensitive resin or a non-photosensitive resin.

It is possible to use a general metal material or a conductive semiconductor material the same as the gate electrode 120 or the source electrode and drain electrode 150 as the first electrode 200 and second electrode 220. For example, it is possible to use Al, Ti, Cr, Co, Ni, Zn, Mo, In, Sn, Hf, Ta, W, Pt or Bi and the like as the first electrode 200 and second electrode 220. An alloy of these materials may also be used as the first electrode 200 and second electrode 220. A nitride of these materials may also be used as the first electrode 200 and second electrode 220. A conductive oxide semiconductor such as ITO, IGO, IZO and GZO and the like may also be used as the first electrode 200 and second electrode 220. A structure in which these films are stacked may also be used as the first electrode 200 and second electrode 220.

An inorganic insulation material such as SiO$_x$, SiN$_x$, SiN$_x$O$_y$ or SiO$_x$N$_y$ and the like may be used as the third insulation layer 210. It is possible to form the third insulation layer 210 by the same method as the underlayer 110. The third insulation layer 210 may have a structure in which the insulation layers described above are stacked. The third insulation layer 210 may be the same material as or a different material than the underlayer 110. It is preferred to use a material with a high dielectric constant as the third insulation layer 210. However, the material used for the third insulation layer 210 is a material with a higher transmittance to water, hydrogen or ammonia than the barrier layer 180.

[Structure of a Pattern End Part of Wiring Layer 170]

Figure 2:
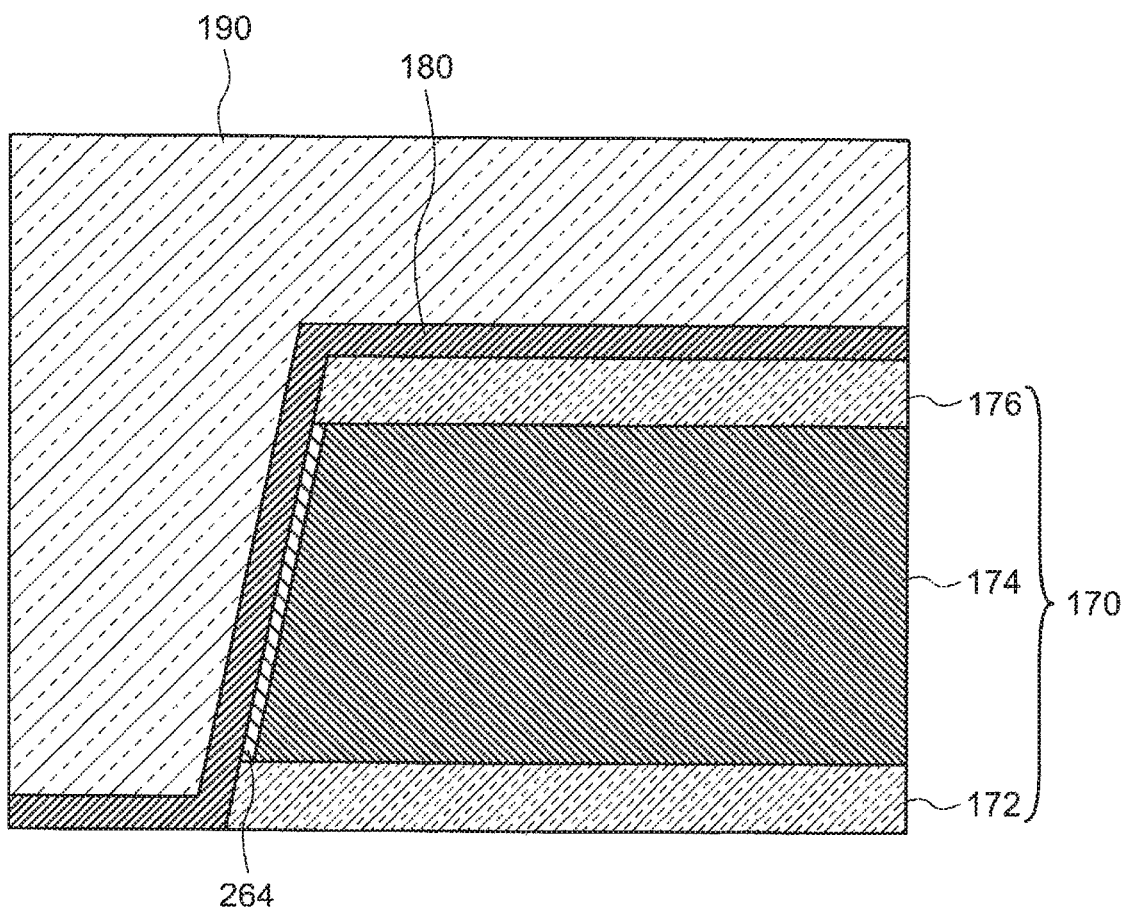
FIG. 2 is a partial exploded diagram of a cross-sectional view of a semiconductor device related to one embodiment of the present invention.

FIG. 2 is a partial exploded diagram of a cross-sectional view of a semiconductor device related to one embodiment of the present invention. FIG. 2 is a diagram in which a pattern end part of the wiring layer 170 enclosed by the dotted line in FIG. 1 is exploded. Furthermore, a structure of the wiring layer 170 having a three-layered stacked structure is exemplified in FIG. 2.

As is shown in FIG. 2, the wiring layer 170 includes a first conducting layer 172, aluminum layer 174 and second conducting layer 176. The aluminum layer 174 is arranged between the first conducting layer 172 and the second conducting layer 176. An oxygen doped region 264 is arranged in the boundary vicinity between the aluminum layer 174 and the barrier layer 180. Although not shown in the diagram, an oxygen doped region may also be arranged between the first conducting layer 172 and the barrier layer 180, and between the second conducting layer 176 and the barrier layer 180.

It is possible to use Ti or MoW for example as the first conducting layer 172 and second conducting layer 176. In addition to Al, it is possible to use Al—Si in which Si is doped as an impurity or Al—Ti in which Ti is doped as an impurity in Al as the aluminum layer. Apart from those described above, it is also possible to use an alloy including Al as the aluminum layer.

[Formation Method of Oxygen Doped Region 264]

The oxygen doped region 264 of the aluminum layer 174 is formed by implanting oxygen ions into the aluminum layer 174. Implantation of oxygen ions is performed by an ion doping method, ion injection method or reactive sputtering method and the like.

In the case where oxygen ions are implanted using a reactive sputtering method, it is possible to implant oxygen ions while simultaneously forming the barrier layer 180 by forming the barrier layer 180 using a reactive sputtering method. Specifically, $O_2$ or Ar and $O_2$ are used as a process gas when forming the barrier layer 180. By using $O_2$ as a process gas, $O_2$ is ionized by a plasma to generate negative oxygen ions, and the generated negative ions are accelerated in a substrate direction by a plasma sheath. The accelerated negative oxygen ions are implanted to the aluminum layer 174 exposed at the pattern end part of the wiring layer 170. In the case where oxygen ions are implanted using a reactive sputtering method, in addition to oxygen Ar which is used as a process gas is also implanted to the oxygen doped region 264. That is, Ar is also doped into the oxygen doped region 264 in addition to oxygen.

In the case of implanting oxygen ions using the method described above, it is preferred to implant the oxygen ions at an angle close to an angle which intersects an inclined surface of an end part of the aluminum layer 174 in order to implant the oxygen ions as deep as possible. That is, it is sufficient to incline a substrate with respect to a bias direction to the ions when implanting the oxygen ions described above.

[Problems Produced by Contact Between an Aluminum Layer and Resin Insulation Layer]

Here, problems which are produced when the aluminum layer 174 of the wiring layer 170 and the second insulation layer 190 which is a resin insulation layer contact are explained. In the case where Al is used as wiring, a structure in which the upper part of Al is covered by a conductive layer such as Ti is common. However, when the upper part of Al is covered by Ti, Al is exposed from Ti at the pattern end part of the wiring. When a resin insulation layer is formed above the wiring layer described above in a state where Al is exposed from Ti, Al and the resin insulation layer come into contact at the pattern end part of the wiring.

As a result of the inventor's research, it was found that a problem is produced whereby an impurity component included in a resin insulation layer reacts with Al when Al contacts with the resin insulation layer as described above which leads to Al corrosion or Al dissolving. The width of the wiring becomes narrow due to the Al reaction described above and in the worst case, the wiring breaks. In addition, as a result of the inventor's research, a problem was determined that when an impurity component included in a resin insulation layer reacts with Al, the dissolved Al component is dispersed within the resin insulation layer which leads to a drop in the level of transparency of the resin insulation layer. Specifically, a problem was determined that in the case where acrylic is used in the resin insulation layer, when Al contacts the acrylic, the acrylic changes color to yellow. When the level of transparency of a resin insulation layer drops, the display quality of the display device drops.

In order to suppress the problems described above, in the case where a resin insulation layer is formed above wiring using Al, a structure is demanded in which Al does not touch with the resin insulation layer. In the structure shown in FIG. 2, it is possible to suppress the problems described above since the barrier layer 180 is arranged between the aluminum layer 174 and the second insulation layer 190. Furthermore, by providing the aluminum layer 174 with oxygen doped region 264 at the boundary vicinity between the aluminum layer 174 and the barrier layer 180, even when coverage of the barrier layer 180 is poor, it is possible to suppress the aluminum layer 174 from contacting the second insulation layer 190.

It is possible to suppress the wiring layer 170 from becoming narrow or breaking by providing the structure described above. As a result, it is possible to obtain the semiconductor device 10 with high reliability. In addition, by providing the structure described above, it is possible to suppress a drop in the level of transparency of the second insulation layer 190. As a result, it is possible to obtain a display device with high display quality.

Second Embodiment

Figure 3:
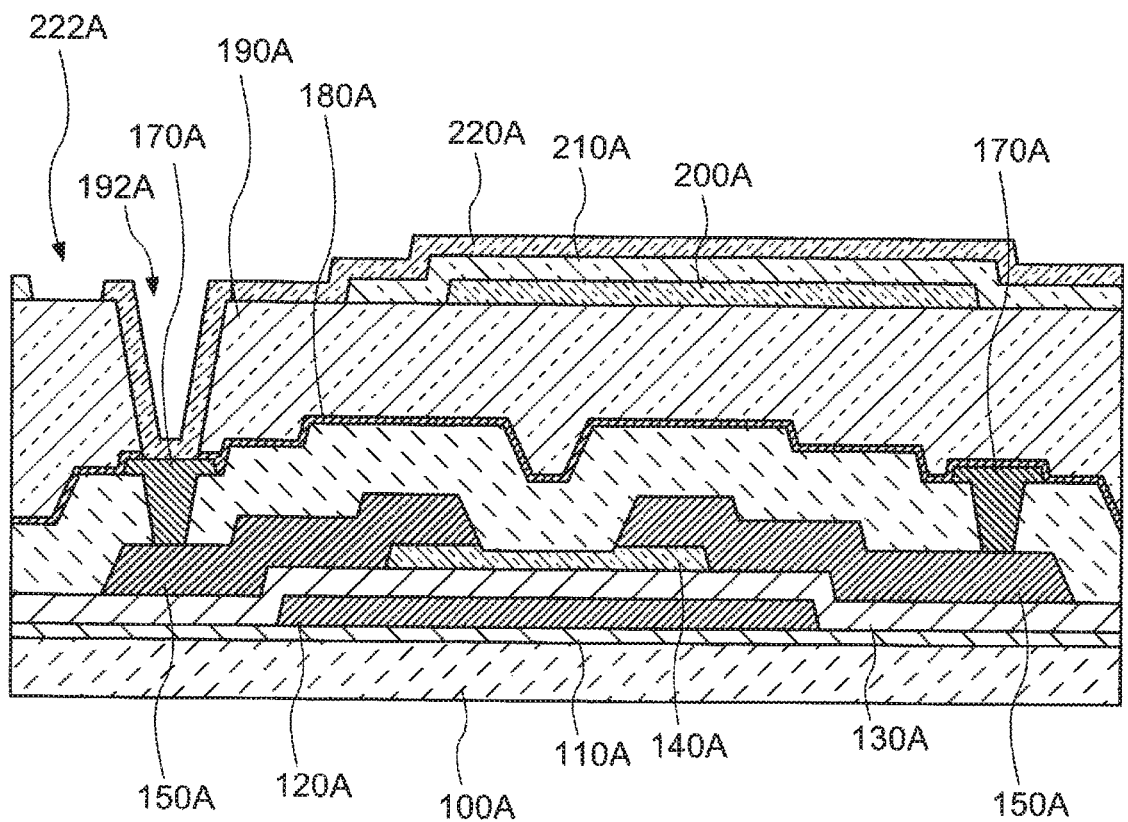
FIG. 3 is a cross-sectional diagram showing a summary of a semiconductor device related to one embodiment of the present invention.

A summary of a semiconductor device related to one embodiment of the present invention is explained using FIG. 3. The same numerals or reference symbols attached with letters of the alphabet are attached after the same numerals to the same parts or parts having similar functions as in the first embodiment and repeated explanations are omitted.

FIG. 3 is a cross-sectional diagram showing a summary of a semiconductor device related to one embodiment of the present invention. Although the semiconductor device 10A shown in FIG. 3 is similar to the semiconductor device 10 shown in FIG. 1, the semiconductor device 10A is different to the semiconductor device 10 in that a part of an upper surface of a second insulation layer 190A is exposed from a second electrode 220A in a region 222A. In the semiconductor device 10A, a part of the second insulation layer 190A is exposed from both a third insulation layer 210A and the second electrode 220A, thereby, even in the case where water, hydrogen or ammonia is discharged from the second insulation layer 190A, the water, hydrogen or ammonia is easily discharged to the exterior from a region where the second insulation layer 190A described above is exposed. Therefore, a rise in internal pressure of the second insulation layer 190 due to the discharge of water, hydrogen or ammonia is suppressed. As a result, it is possible to suppress the semiconductor device 10A from breaking.

Third Embodiment

Figure 4:
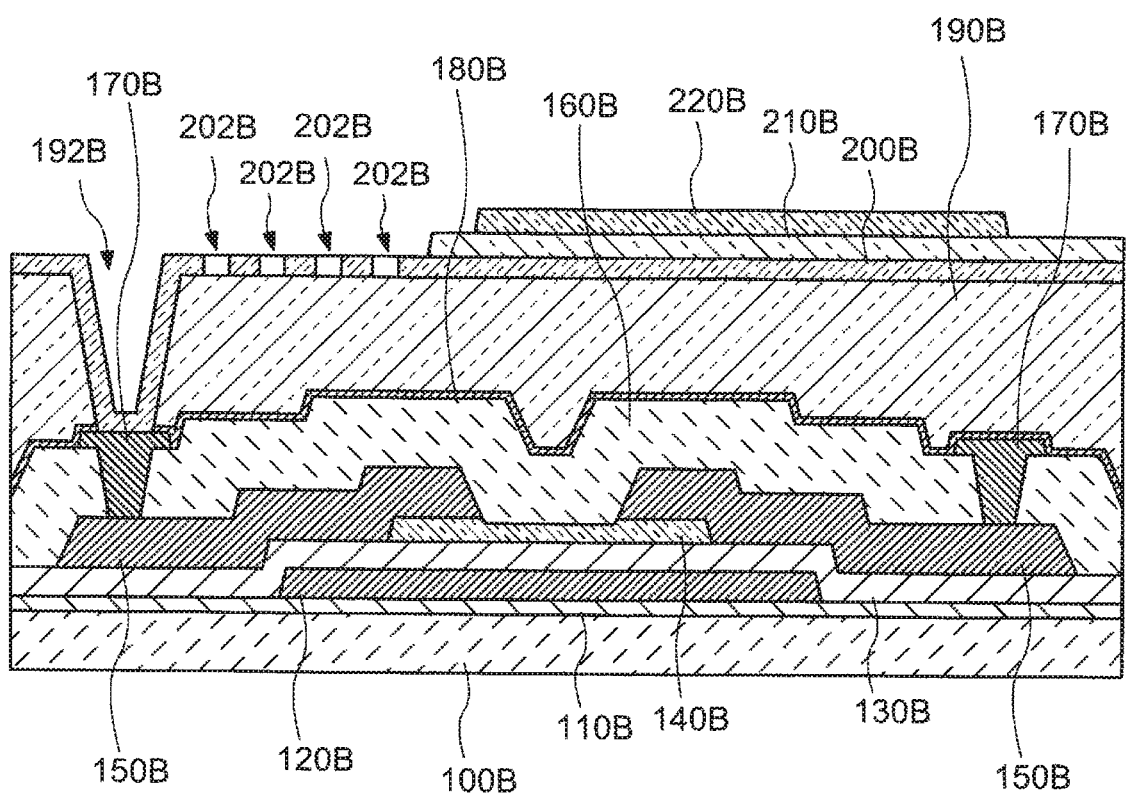
FIG. 4 is a cross-sectional diagram showing a summary of a semiconductor device related to one embodiment of the present invention.

FIG. 4 is a cross-sectional diagram showing a summary of a semiconductor device related to one embodiment of the present invention. Although a semiconductor device 10B shown in FIG. 4 is similar to the semiconductor device 10 shown in FIG. 1, the semiconductor device 10B is different to the semiconductor device 10 in that a first electrode 200B is connected to a wiring layer 170B via an aperture part 192B and a plurality of aperture parts 202B is arranged in the first electrode 200B. By providing a structure in which the first electrode 200B is connected to the wiring layer 170B, it is possible to form the first electrode 200B immediately after forming the aperture part 192B. In this case, since a film other than the first electrode 200B is not formed on the surface of the wiring layer 170B exposed in the aperture part 192B, the surface of the wiring layer 170B is not altered, and it is possible to obtain a good contact between the wiring layer 170B and first electrode 200B.

According to the semiconductor device 10B, the aperture part 202B is arranged in the first electrode 200B. Therefore, even in the case where water, hydrogen or ammonia is discharged from the second insulation layer 190B, the water, hydrogen or ammonia is easily discharged to the exterior due to the aperture part 202B from a region where the second insulation layer 190B is exposed. Therefore, a rise in internal pressure of the second insulation layer 190 due to the discharge of water, hydrogen or ammonia is suppressed. As a result, it is possible to suppress the semiconductor device 10B from breaking.

Fourth Embodiment

Figure 5:
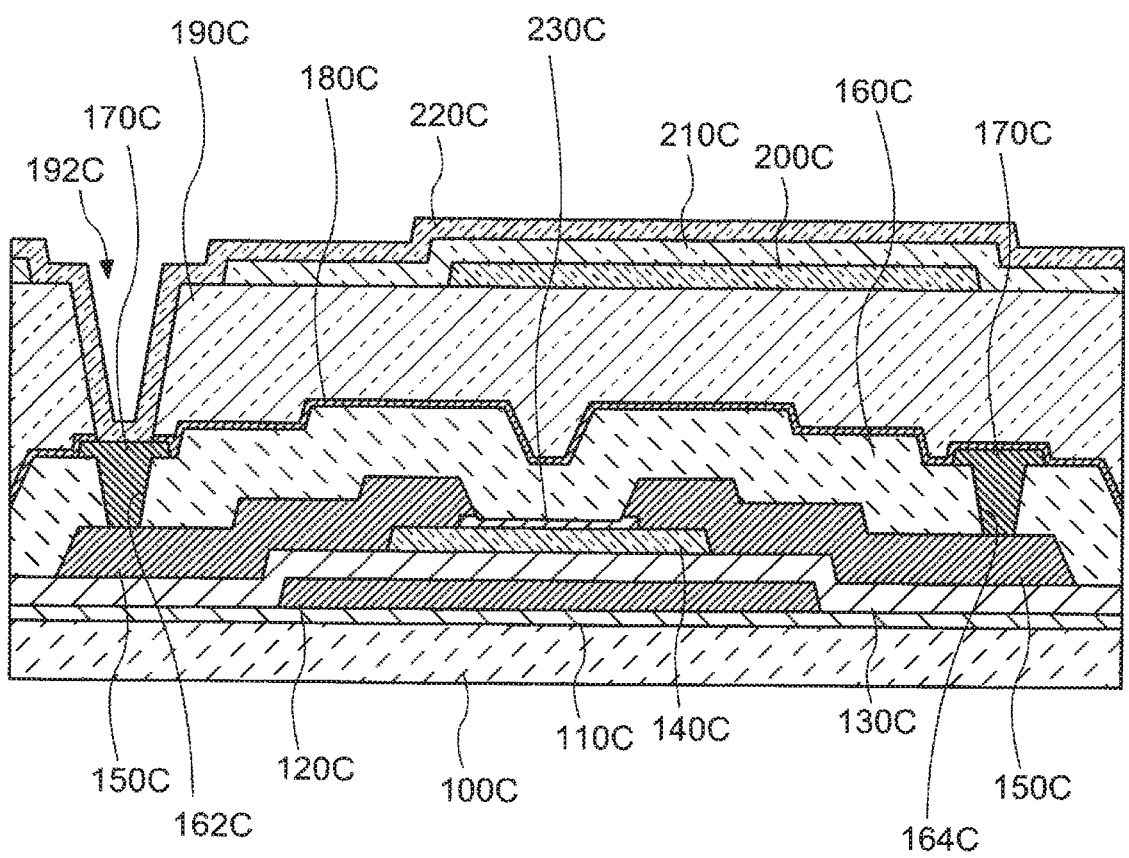
FIG. 5 is a cross-sectional diagram showing a summary of a semiconductor device related to one embodiment of the present invention.

FIG. 5 is a cross-sectional diagram showing a summary of a semiconductor device related to one embodiment of the present invention. Although a semiconductor device 10C shown in FIG. 5 is similar to the semiconductor device 10 shown in FIG. 1, the semiconductor device 10C is different to the semiconductor device 10 in that an etching stopper 230C is arranged above an oxide semiconductor layer 140C corresponding to a channel region. That is, the semiconductor device 10C is a channel stopper type transistor.

By arranging the etching stopper 230C above the oxide semiconductor layer 140C, it is possible to prevent the oxide semiconductor layer 140C from being exposed to etching by channel etching. Therefore, it is possible to suppress the oxide semiconductor layer 140C from being altered due to channel etching. Furthermore, it is possible to suppress water, hydrogen or ammonia discharged from the second insulation layer 190C from reaching the oxide semiconductor layer 140C in a channel region. As a result, it is possible to obtain the semiconductor device 10C with high reliability.

Fifth Embodiment

Figure 6:
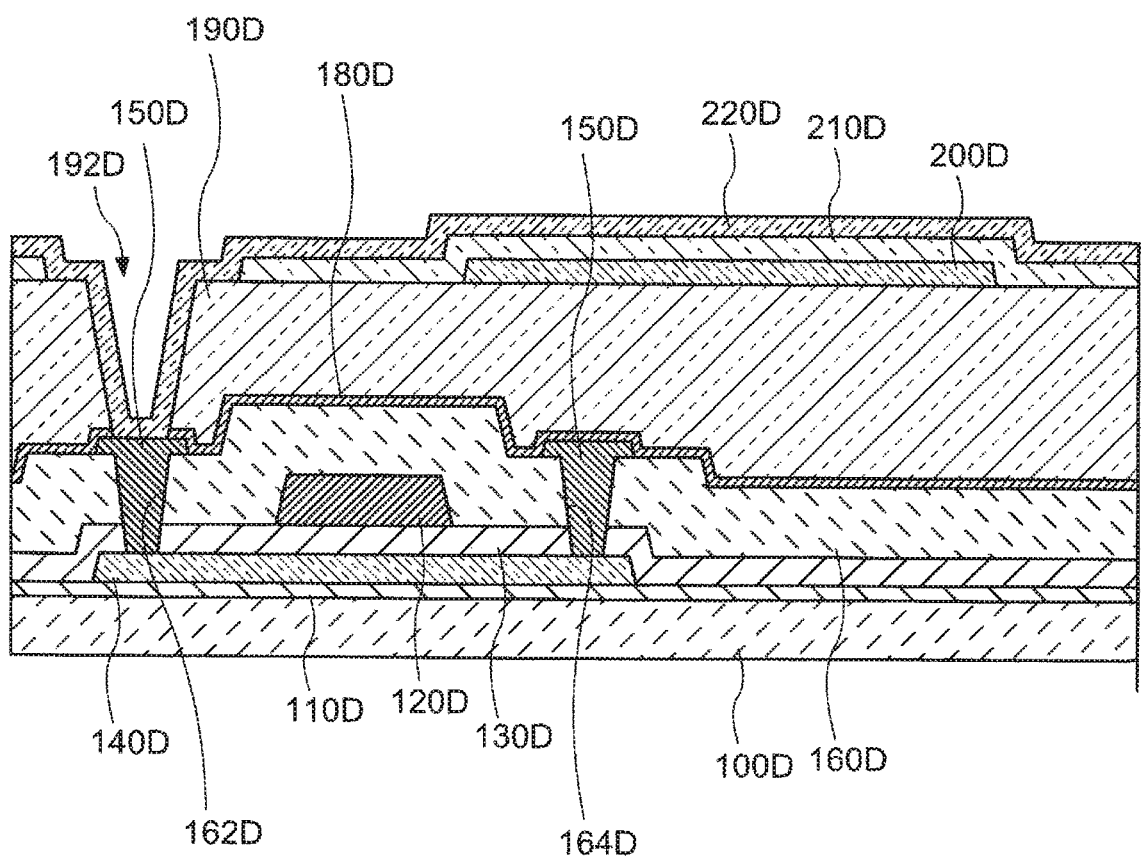
FIG. 6 is a cross-sectional diagram showing a summary of a semiconductor device related to one embodiment of the present invention.

FIG. 6 is a cross-sectional diagram showing a summary of a semiconductor device related to one embodiment of the present invention. Although a semiconductor device 10D shown in FIG. 6 is similar to the semiconductor device 10 shown in FIG. 1, the semiconductor device 10D is different to the semiconductor device 10 in that a structure is provided in which an oxide semiconductor layer 140D, a gate insulation layer 130D and a gate electrode 120D are stacked above an underlayer 110D in this order. That is, the semiconductor device 10D is a top-gate type transistor.

As is shown in FIG. 6, the semiconductor device 10D includes a substrate 100D, an underlayer 110D, a gate electrode 120D, a gate insulation layer 130D, an oxide semiconductor layer 140D, a first insulation layer 160D, a source electrode and drain electrode 150D, a barrier layer 180D, a second insulation layer 190D, a first electrode 200D, a third insulation layer 210D and a second electrode 220D. The oxide semiconductor layer 140D is arranged above the underlayer 110D. The gate insulation layer 130D is arranged above the oxide semiconductor layer 140D. The gate electrode 120D is arranged above the gate insulation layer 130D. The source electrode and drain electrode 150D is connected to the oxide semiconductor layer 140D via aperture parts 162D, 164D arranged in the gate insulation layer 130D and first insulation layer 160D.

In the semiconductor device 10D, the oxide semiconductor layer 140D directly below the gate electrode 120D functions as a channel. In order to further improve an ON current, the oxide semiconductor layer 140D from a contact region between the source electrode and drain electrode 150D and the oxide semiconductor layer 140D to a region directly below the gate electrode 120D may be provided with low resistance.

When an upper part of the oxide semiconductor layer 140D in a channel region is covered by the gate electrode 120D, it is possible to prevent water, hydrogen or ammonia discharged from the second insulation layer 190D from reaching the oxide semiconductor layer 140D in the channel region. As a result, it is possible to obtain the semiconductor device 10D with high reliability.

Although the semiconductor device 10D shown in FIG. 6 is exemplified with a structure in which a top-gate type transistor is applied to the semiconductor device 10 shown in FIG. 1, a top-gate type transistor may also be applied to the semiconductor device 10A shown in FIG. 3 to the semiconductor device 10C shown in FIG. 5.

[Transmittance of the Barrier Layer 180 and Third Insulation Layer 210 with Respect to Water, Hydrogen and Ammonia]

Figure 7:
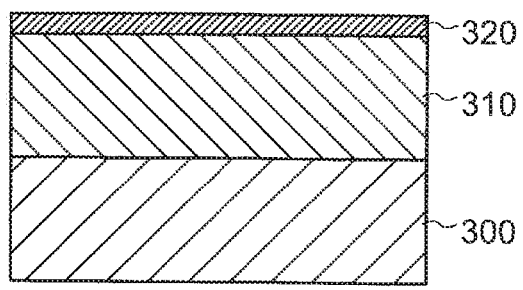
FIG. 7 is a diagram showing a cross-sectional structure of an evaluation sample for evaluating the characteristics of a protective layer of a semiconductor device related to one embodiment of the present invention.
Figure 7:
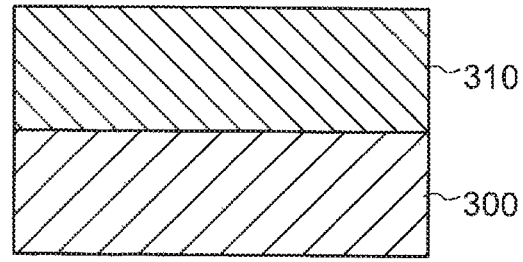
Figure 8:
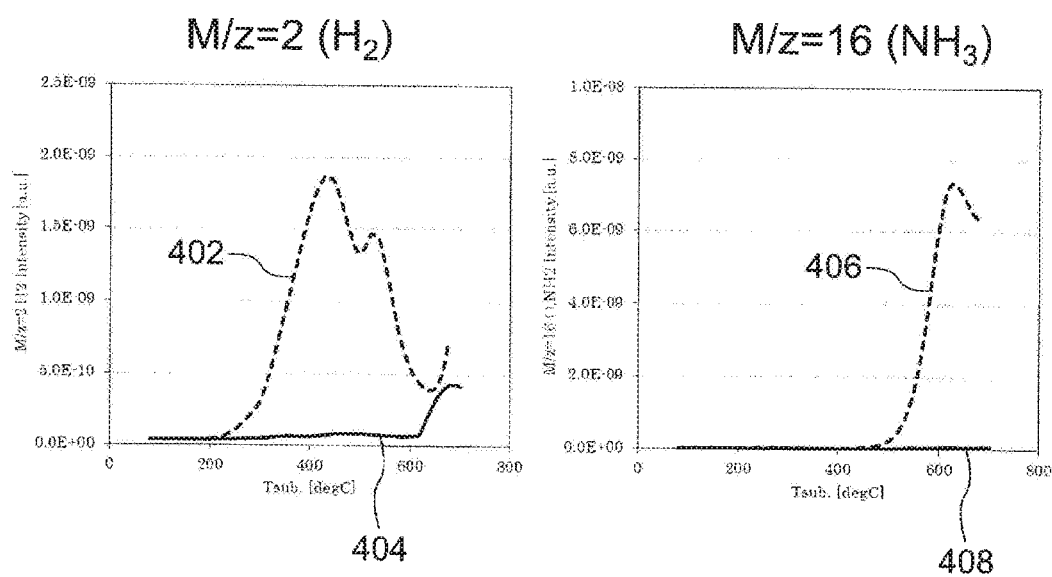
FIG. 8 is a TDS spectrum showing the characteristics of a protective layer of a semiconductor device related to one embodiment of the present invention.

Transmittance of the barrier layer 180 and the third insulation layer 210 with respect to water, hydrogen and ammonia is explained using FIG. 7 and FIG. 8. FIG. 7 is a diagram showing a cross-sectional structure of an evaluation sample for evaluating the characteristics of a protective layer of a semiconductor device related to one embodiment of the present invention. Two types of structure (A) and (B) were used as evaluation samples. Evaluation sample (A) has a structure in which a $SiN_x$ film 310 formed by a CVD method and an $AlO_x$ film 320 formed by a sputtering method are stacked in order above a silicon wafer 300. Evaluation sample (B) has a structure in which only a $SiN_x$ film 310 formed by a CVD method is formed above a silicon wafer 300. In either sample, the film thickness of the $SiN_x$ film 310 is about 200 nm. The film thickness of the $AlO_x$ film 320 in evaluation sample (A) is about 20 nm. An analysis was performed by a thermal desorption gas analysis method (TDS method) using the two types of sample shown in FIG. 7.

A TDS analysis is an evaluation means in which an evaluation sample is placed above a heating stage arranged within a vacuum chamber and the mass of a gas discharged from the evaluation sample by increasing the temperature of the heating stage is measured using a quadrupole mass spectrometer. It is possible to specify the type of gas discharged from the evaluation sample from a mass analysis of the gas.

FIG. 8 is a TDS spectrum showing the characteristics of a protective layer of a semiconductor device related to one embodiment of the present invention. The TDS spectrum in FIG. 8 shows the TDS analysis results evaluated with respect to the evaluation sample shown in FIG. 7. In the TDS spectrum shown in FIG. 8, the M/z=2 spectrum is data showing desorption of hydrogen ($H_2$), and the M/z=16 spectrum is data showing desorption of ammonia ($NH_3$). In each of the TDS spectrums, the solid line spectrums 404, 408 are TDS spectrums of the evaluation sample (A) and the dotted line spectrums 402, 406 are TDS spectrums of the evaluation sample (B) in FIG. 7.

As is shown in FIG. 8, in the dotted line spectrum 402 of the evaluation sample (B), a peak showing desorption of $H_2$ is confirmed in a temperature range of 300° C. to 600° C. On the other hand, in the solid line spectrum 404 of the evaluation sample (A), a peak showing desorption of $H_2$ is not confirmed. That is, the $AlO_x$ film 320 blocks hydrogen discharged from the $SiN_x$ film 310 and suppresses that the hydrogen discharges to the exterior. In other words, transmittance of the $AlO_x$ film 320 with respect to hydrogen is low compared to the $SiN_x$ film 310.

Similarly, in the dotted line spectrum 406 of the evaluation sample (B), a peak showing desorption of $NH_3$ is confirmed in a temperature range of 500° C. to 700° C. On the other hand, in the solid line spectrum 408 of the evaluation sample (A), a peak showing desorption of $NH_3$ is not confirmed. That is, the $AlO_x$ film 320 blocks ammonia discharged from the $SiN_x$ film 310 and suppresses that the ammonia discharges to the exterior. In other words, transmittance of the AlO$_x$ film 320 with respect to ammonia is low compared to the SiN$_x$ film 310.

Even in the case where an insulation material including AlO$_x$N$_y$ or an aluminum oxide such as AlN$_x$O$_y$ is used instead of the AlO$_x$ film 320, or in the case where an inorganic insulation material such as SiO$_x$, SiN$_x$O$_y$ or SiO$_x$N$_y$ and the like is used instead of the SiN$_x$ film 310, similar results to those described above are obtained.

From the results described above, it was confirmed that transmittance with respect to water, hydrogen and ammonia is lower in the barrier layer 180 in which an insulation material including an aluminum oxide such as AlO$_x$, AlO$_x$N$_y$ or AlN$_x$O$_y$ is used than the third insulation layer 210 in which an inorganic insulation material such as SiO$_x$, SiN$_x$, SiN$_x$O$_y$ or SiO$_x$N$_y$ and the like is used.

[Transistor Characteristics in the Case where AlO$_x$ or SiN$_x$ is Used as the Barrier Layer 180]

Figure 9:
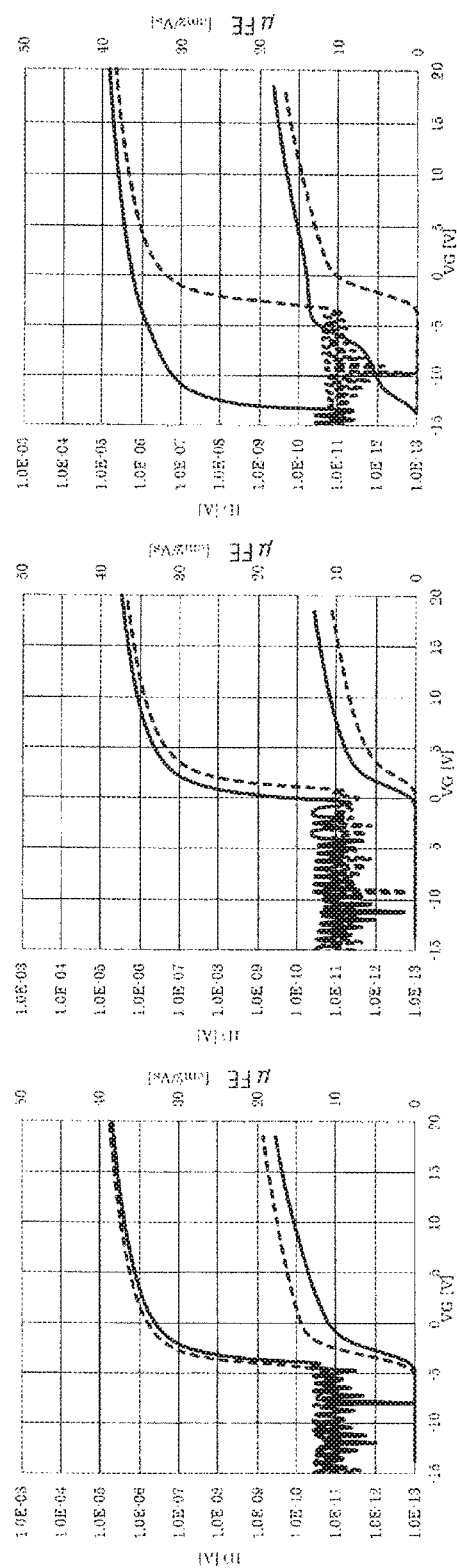
FIG. 9 is a diagram showing electrical characteristics after an acceleration test of a semiconductor device related to one embodiment of the present invention.
Figure 10:
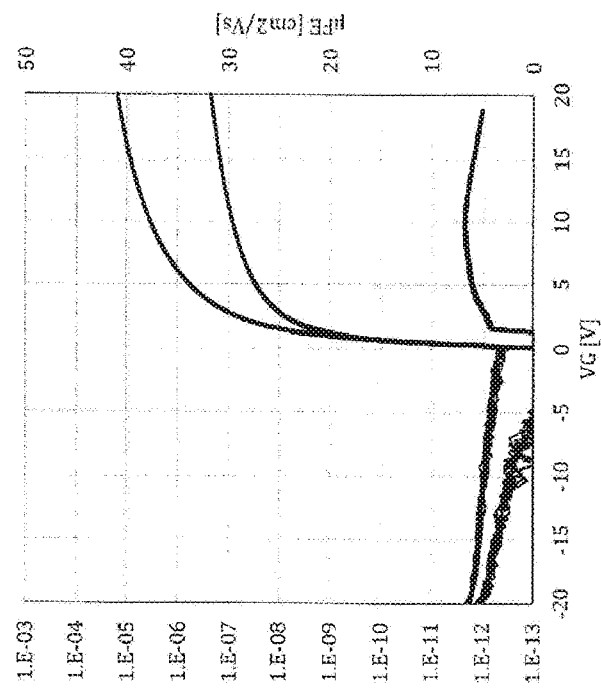
FIG. 10 is a diagram showing electrical characteristics of a short L length semiconductor device related to one embodiment of the present invention.
Figure 10:
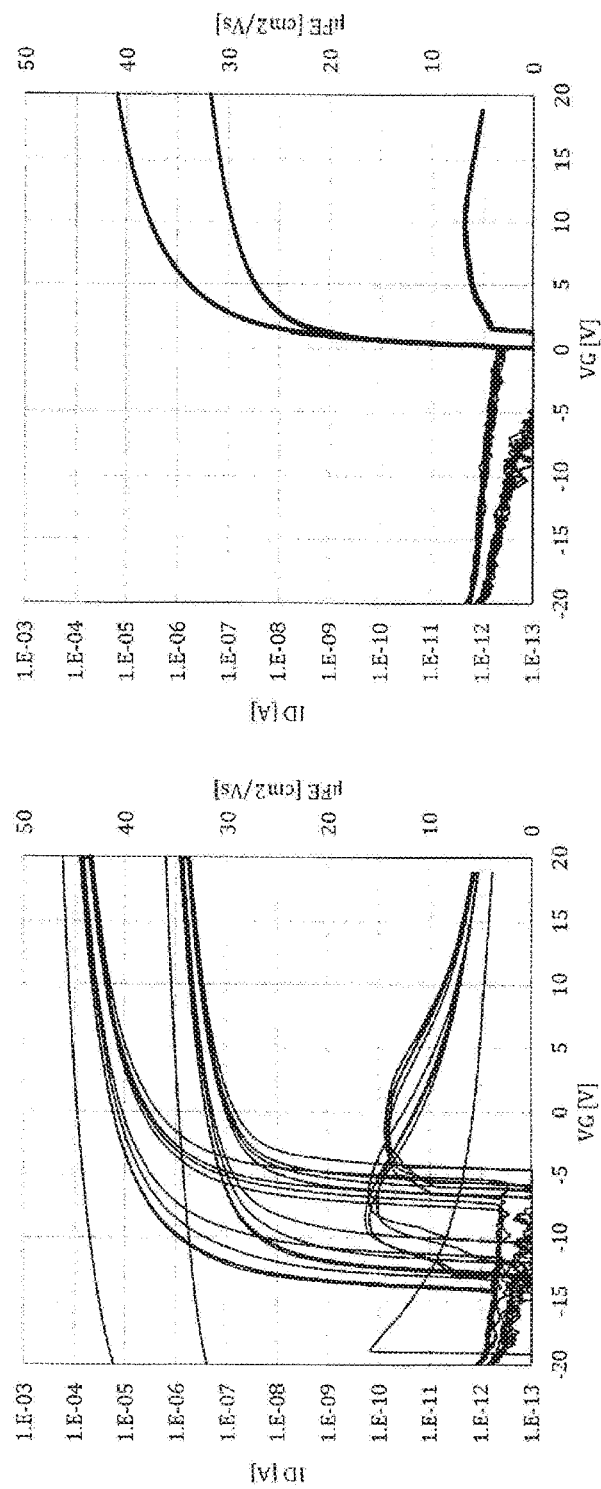
Figure 11:
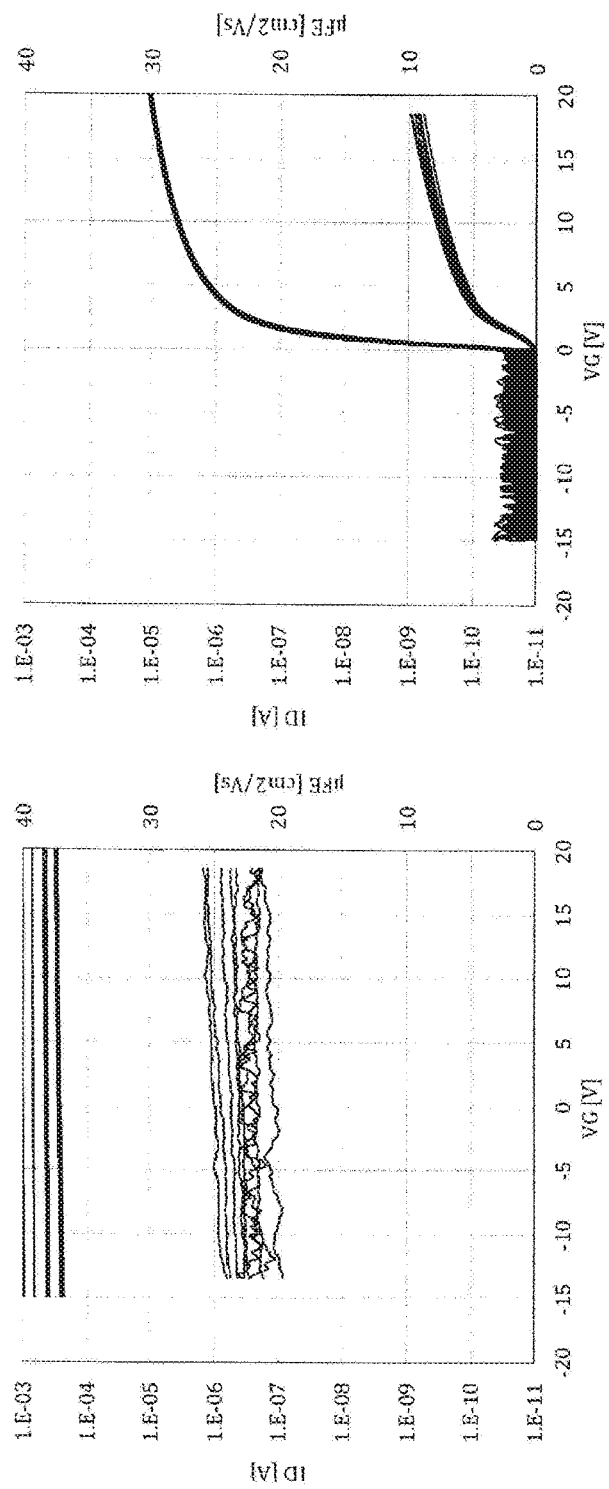
FIG. 11 is a diagram showing electrical characteristics of a short L length semiconductor device related to one embodiment of the present invention.

The results of comparing the transistor characteristics in the case where AlO$_x$ or SiN$_x$ is used as the barrier layer 180 in the structure of the semiconductor device 10 is explained using FIG. 9 to FIG. 11.

FIG. 9 is a diagram showing electrical characteristics after an acceleration test of a semiconductor device related to one embodiment of the present invention. In FIG. 9, transistor characteristics before an acceleration test of a resistance environment (called PCT [pressure cooker test]) are shown by a dotted line, and transistor characteristics after a PCT test are shown by a solid line. A PCT test surveys a change in transistor characteristics before and after the PCT test by holding a transistor within a chamber at a temperature of 120° C. and humidity of 90% for 120 hours. Furthermore, a measurement of the transistor characteristics shown in FIG. 9 was performed at room temperature and in a dark room.

In the transistor characteristics shown in FIG. 9, the transistor characteristics of a [barrier layer: SiN$_x$] show transistor characteristics in the case where SiN$_x$ was used as the barrier layer 180 of the semiconductor device 10. The transistor characteristics of a [barrier layer: AlO$_x$] show transistor characteristics in the case where AlO$_x$ was used as the barrier layer 180 of the semiconductor device 10. Transistor characteristics of [barrier layer: none] shows transistor characteristics when the barrier layer 180 of the semiconductor device 10 was omitted. Although there is no significant change in transistor characteristics in the evaluation samples [barrier layer: SiN$_x$] and [barrier layer: AlO$_x$] before and after a PCT test, the transistor characteristics change significantly before and after a PCT test in the evaluation sample [barrier layer: none]. That is, it was determined that a reliability equivalent to SiN$_x$ can be obtained by using AlO$_x$ as the barrier layer 180. That is, it was determined that AlO$_x$ has an equivalent resistance to water as SiN$_x$. In other words, it was determined that transmittance of AlO$_x$ to water was similarly as low as the transmittance to water of SiN$_x$.

FIG. 10 and FIG. 11 are diagrams showing the electrical characteristics of a short L length semiconductor device related to one embodiment of the present invention. The transistor characteristics shown in FIG. 10 are characteristics of a semiconductor device when a channel length/channel width is L/W=6/6 μm. The transistor characteristics shown in FIG. 11 are characteristics of a semiconductor device when L/W=3/15 μm. The transistor characteristics shown in FIG. 10 and FIG. 11 are displayed as overlapping transistor characteristics of nine semiconductor devices formed in a substrate. Furthermore, the measurement of the transistor characteristics shown in FIG. 10 and FIG. 11 was performed at room temperature in a dark room.

The same as FIG. 9, in the transistor characteristics shown in FIG. 10 and FIG. 11, the transistor characteristics of a [barrier layer: SiN$_x$] show transistor characteristics in the case where SiN$_x$ was used as the barrier layer 180 of the semiconductor device 10. The transistor characteristics of a [barrier layer: AlO$_x$] show transistor characteristics in the case where AlO$_x$ was used as the barrier layer 180 of the semiconductor device 10. Although many transistor characteristic abnormalities occurred in the evaluation sample [barrier layer: SiN$_x$] in both FIG. 10 and FIG. 11, no transistor characteristics abnormalities occurred in the evaluation sample [barrier layer: AlO$_x$]. That is, it was determined that by using AlO$_x$ in the barrier layer 180, it is possible to suppress water, hydrogen or ammonia from reaching an oxide semiconductor layer in a channel region from other layers. Furthermore, although SiN$_x$ has a lower transmittance to water, since hydrogen or ammonia is discharged from the SiN$_x$ itself, it is inappropriate as a barrier layer of an oxide semiconductor.

As described above, by using AlO$_x$ as a barrier layer 180 of a semiconductor device 10, it was confirmed that it is possible to obtain a semiconductor device with high durability, and it is possible to obtain a semiconductor device with no transistor characteristic abnormalities even in the case of a short L length semiconductor device.

The present invention is not limited to any of the above-described embodiments or modifications, and may be appropriately altered without departing from the gist of the present invention.

What is claimed is:

1. A semiconductor device comprising:
   a gate electrode;
   an oxide semiconductor layer above the gate electrode;
   a gate insulation layer between the gate electrode and the oxide semiconductor layer;
   a first insulation layer above the gate electrode, a first aperture part arranged in the first insulation layer;
   a wiring including an aluminum layer above the first insulation layer, the wiring being electrically connected to the oxide semiconductor layer via the first aperture part;
   a barrier layer including aluminum oxide, the barrier layer covering above the first insulation layer, above the wiring and a side of the wiring; and
   an organic insulation layer above the barrier layer,
   wherein
   the barrier layer contacts the wiring above the wiring and side of the wiring,
   the aluminum layer includes an oxygen doped region in a barrier layer side of the aluminum layer,
   the wiring includes a first metal layer and a second metal layer,
   the aluminum layer and the oxygen doped region are arranged between the first metal layer and the second metal layer, and
   Ar is doped into the oxygen doped region.

2. The semiconductor device according to claim 1, further comprising:
   a first electrode above the organic insulation layer;
   a second electrode opposing the first electrode and electrically connected to the wiring via a second aperture part arranged in the organic insulation layer; and
   a second insulation layer electrically insulating the first electrode and the second electrode and exposing the second aperture part and an upper surface of the organic insulation layer.

3. The semiconductor device according to claim 2, wherein transmittance of the barrier layer to water, hydrogen or ammonia is lower than transmittance of the second insulation layer to water, hydrogen or ammonia.

4. The semiconductor device according to claim 2, wherein the second electrode covers an upper surface of the organic insulation layer exposed by the second aperture part.

5. The semiconductor device according to claim 2, wherein a part of an upper surface of the organic insulation layer is exposed from the second electrode and the second insulation layer.

* * * * *